(12) United States Patent
Konno et al.

(10) Patent No.: US 11,049,983 B2
(45) Date of Patent: Jun. 29, 2021

(54) CONDUCTIVE PASTE AND SOLAR CELL

(71) Applicant: NAMICS CORPORATION, Niigata (JP)

(72) Inventors: Seiya Konno, Niigata (JP); Noriyuki Sakai, Niigata (JP)

(73) Assignee: NAMICS CORPORATION, Niigata (JP)

(*) Notice: Subject to any disclaimer, the term of this patent is extended or adjusted under 35 U.S.C. 154(b) by 56 days.

(21) Appl. No.: 16/323,762

(22) PCT Filed: Jul. 12, 2017

(86) PCT No.: PCT/JP2017/025339
§ 371 (c)(1),
(2) Date: Feb. 6, 2019

(87) PCT Pub. No.: WO2018/037746
PCT Pub. Date: Mar. 1, 2018

(65) Prior Publication Data
US 2020/0185548 A1   Jun. 11, 2020

(30) Foreign Application Priority Data
Aug. 23, 2016 (JP) .............................. JP2016-162915

(51) Int. Cl.
*H01L 31/0224* (2006.01)
*C03C 3/062* (2006.01)
(Continued)

(52) U.S. Cl.
CPC ...... *H01L 31/022425* (2013.01); *C03C 3/062* (2013.01); *C03C 3/066* (2013.01);
(Continued)

(58) Field of Classification Search
None
See application file for complete search history.

(56) References Cited

U.S. PATENT DOCUMENTS 7,736,546 B2 * 6/2010 Prunchak ........ H01L 31/022425
252/519.14
2009/0189126 A1   7/2009 Prunchak
(Continued)

FOREIGN PATENT DOCUMENTS

EP          3032544 A1 *  6/2016  ..... H01L 31/022425
JP       2014031294 A     2/2014
(Continued)

OTHER PUBLICATIONS

International Search Report (ISR) dated Oct. 10, 2017 issued in International Application No. PCT/JP2017/025339.
(Continued)

*Primary Examiner* — Katie L. Hammer
(74) *Attorney, Agent, or Firm* — Holtz, Holtz & Volek PC

(57) ABSTRACT

Provided is a conductive paste for forming bus bar electrodes having high adhesive strength with respect to a passivation film in a crystalline silicon solar cell without having a detrimental effect on the passivation film so as to affect solar cell properties.

The conductive paste is a conductive paste formed on a passivation film of a solar cell, containing: (A) silver particles, (B) an organic vehicle, and (C) glass fit containing $TeO_2$ at 1.0 mol % to 20 mol % and $Bi_2O_3$ at 10 mol % to 30 mol %.

17 Claims, 4 Drawing Sheets

(51) Int. Cl.
*C03C 8/04* (2006.01)
*H01B 1/22* (2006.01)
*C03C 14/00* (2006.01)
*H01L 31/0216* (2014.01)
*C03C 3/066* (2006.01)
*H01B 1/16* (2006.01)
*H01L 23/00* (2006.01)
*C08K 3/40* (2006.01)
*C08K 3/08* (2006.01)

(52) U.S. Cl.
CPC .............. *C03C 8/04* (2013.01); *H01B 1/16* (2013.01); *H01B 1/22* (2013.01); *H01L 24/50* (2013.01); *H01L 31/02167* (2013.01); *H01L 31/02168* (2013.01); *C03C 14/004* (2013.01); *C08K 3/08* (2013.01); *C08K 3/40* (2013.01); *Y02E 10/546* (2013.01); *Y02E 10/547* (2013.01)

(56) References Cited

U.S. PATENT DOCUMENTS

| | | | |
|---|---|---|---|
| 2011/0094578 A1 | 4/2011 | Akimoto et al. | |
| 2014/0042375 A1* | 2/2014 | Kim | C03C 8/18 252/514 |
| 2014/0196781 A1* | 7/2014 | Ito | H01B 1/22 136/256 |
| 2015/0021527 A1* | 1/2015 | Shin | H01B 1/22 252/514 |
| 2015/0115207 A1 | 4/2015 | Shih et al. | |
| 2016/0056311 A1 | 2/2016 | Kim et al. | |
| 2016/0190362 A1* | 6/2016 | Neidert | H01L 31/022425 136/244 |
| 2017/0194519 A1 | 7/2017 | Matsushima et al. | |

FOREIGN PATENT DOCUMENTS

| | | |
|---|---|---|
| JP | 5523349 B2 | 6/2014 |
| JP | 5559510 B2 | 7/2014 |
| JP | 2015056586 A | 3/2015 |
| JP | 2015092567 A | 5/2015 |
| JP | 2016134556 A | 7/2016 |
| JP | 2016150883 A | 8/2016 |
| WO | 2016047564 A1 | 3/2016 |

OTHER PUBLICATIONS

Written Opinion dated Oct. 10, 2017 issued in International Application No. PCT/JP2017/025339.

* cited by examiner

CONDUCTIVE PASTE AND SOLAR CELL

TECHNICAL FIELD

The present invention relates to a conductive paste used to form electrodes of a semiconductor device and the like. More particularly, the present invention relates to a conductive paste for forming electrodes of a solar cell. In addition, the present invention relates to a solar cell produced using that conductive paste for forming electrodes.

BACKGROUND ART

Semiconductor devices such as crystalline silicon solar cells are produced by using crystalline silicon, obtained by processing single crystal silicon or polycrystalline silicon into the shape of a flat plate, for the substrate thereof. Semiconductor devices typically have electrodes formed using a conductive paste for electrode formation on the surface of the silicon substrate in order to make electrical contact with the outside. Among semiconductor devices having electrodes formed in this manner, the production output of crystalline silicon solar cells has increased considerably in recent years. These crystalline silicon solar cells have an impurity diffusion layer, antireflection film and light incident side electrodes on one surface of a crystalline silicon substrate and have back side electrodes on the other surface. Electrical power generated by the crystalline silicon solar cell can be extracted to the outside by the light incident side electrodes and back side electrodes.

Conductive paste containing conductive powder, glass frit, organic binder, solvent and other additives has been used to form the electrodes of conventional crystalline silicon solar cells. Silver particles (silver powder) are mainly used for the conductive powder.

Glass frit for conductive ink arranged on an antireflective film provided on the semiconductor used as a solar cell is described in, for example, Patent Document 1 as glass frit contained in conductive paste. More specifically, Patent Document 1 describes glass frit characterized by containing $TeO_2$, $B_2O_3$, $Bi_2O_3$ and $SiO_2$ but not containing intentionally added lead, and forming an ohmic junction between the conductive ink and semiconductor by penetrating through the antireflective film during firing.

Patent Document 2 describes a solar cell element at least containing a conductive powder having silver as the main component thereof, tellurium-based glass frit containing 30 mol % to 90 mol % of tellurium oxide as a network-forming component, and an organic vehicle, and provided with electrodes formed by coating a conductive paste having a lead content of 1000 ppm or less onto a semiconductor substrate provided with a silicon nitride layer on the surface thereof followed by firing. In addition, Patent Document 2 describes that the electrodes of the solar cell element have a structure provided with a surface electrode layer having silver as the main component thereof, a glass layer having tellurium-based glass as the main component thereof, and a silicon oxide layer containing a plurality of silver particles precipitated between the glass layer and the silicon nitride layer by the aforementioned firing, on the silicon nitride layer on the semiconductor substrate.

PRIOR ART DOCUMENTS

Patent Documents

Patent Document 1: JP 5523349 B
Patent Document 2: JP 5559510 B

DISCLOSURE OF THE INVENTION

Problems to be Solved by the Invention

FIG. 1 shows an example of a cross-sectional schematic diagram of an ordinary crystalline silicon solar cell. As shown in FIG. 1, in the crystalline silicon solar cell, an impurity diffusion layer 4 (such as an n-type impurity diffusion layer having an n-type impurity diffused therein) is formed on a surface on the incident light (light incident side surface) of a crystalline silicon substrate 1 (such as a p-type crystalline silicon substrate 1). An antireflective film 2 is formed on the impurity diffusion layer 4. An electrode pattern of light incident side electrodes 20 (surface electrodes) is printed on the antireflective film 2 using a conductive paste by screen printing and the like. The light incident side electrodes 20 are formed by drying and firing the printed conductive paste. During this firing, the conductive paste tires through the antireflective film 2. As a result of the conductive paste firing through the antireflective film 2 in this manner, the light incident side electrodes 20 can be formed so as to contact the impurity diffusion layer 4. Furthermore, fire-through refers to etching an insulating film in the form of the antireflective film 2 with glass frit and the like contained in the conductive paste to form electrical continuity between the light incident side electrodes 20 and the impurity diffusion layer 4. Since light is not required to enter from the hack side of the p-type crystalline silicon substrate 1 (surface on the opposite side from the light incident side surface), back side electrodes 15 (back side full-surface electrodes 15b) are typically formed over the nearly the entire surface of the back side. A p-n junction is formed at the interface between the p-type crystalline silicon substrate 1 and the impurity diffusion layer 4. The majority of incident light that has entered the crystalline silicon solar cell enters the p-type crystalline silicon substrate 1 after having penetrated the antireflective film 2 and the impurity diffusion layer 4 and light is absorbed during this process resulting in the generation of electron-hole pairs. These generated electron-hole pairs are such that electrons are separated into the light incident side electrodes 20 and holes are separated into the back side electrodes 15 by the electric field generated by the p-n junction. The electrons and holes (carriers) are extracted to the outside by way of these electrodes as electrical current.

FIG. 2 shows an example of a schematic diagram of the light incident side surface of a typical crystalline silicon solar cell. As shown in FIG. 2, bus bar electrodes (light incident side bus bar electrodes 20a) and finger electrodes 20b are arranged on the light incident side surface of the crystalline silicon solar cell as the light incident side electrodes 20. In the examples shown in FIGS. 1 and 2, electrons of the electron-hole pairs generated by incident light that has entered the crystalline silicon solar cell are collected in the finger electrodes 20b and further collected in the light incident side bus bar electrodes 20a. Interconnecting metal ribbon, the periphery of which is covered with solder, is soldered to the light incident side bus bar electrodes 20a. Current is led outside the crystalline silicon solar cell by this metal ribbon.

FIG. 3 shows an example of a schematic diagram of the back side of a typical crystalline silicon solar cell. As shown in FIG. 3, back side TAB electrodes 15a (also referred to as back side bus bar electrodes 15a) are arranged as the back side electrodes 15, and back side full-surface electrodes 15b are arranged over nearly the entire surface of the back side with the exception of the portion where the back side TAB electrodes 15a are arranged. In the examples shown in FIGS. 1 and 3, holes among the electron-hole pairs generated by incident light that has entered the crystalline silicon solar cell are collected in the back side electrodes 15 having aluminum as the main material thereof and are further collected in the back side TAB electrodes 15a having silver as the main material thereof. Aluminum becomes a p-type impurity in the crystalline silicon, and as a result of forming the back side electrodes 15 using for the raw material thereof conductive paste having aluminum as the main material thereof, a back surface field (BSF) can be formed on the back side of the crystalline silicon solar cell when firing the conductive paste. However, aluminum is difficult to solder. Consequently, bus bar electrodes having silver for the main material thereof (back side TAB electrodes 15a) are formed in order to secure an area for soldering the interconnecting metal ribbon to the back side. Since portions are present where the back side TAB electrodes 15a and back side full-surface electrodes 15b overlap, electrical contact is maintained between the two. Interconnecting metal ribbon, the periphery of which is covered with solder, is soldered to the back side TAB electrodes 15a having silver for the main material thereof. Current is led outside the crystalline silicon solar cell by means of this metal ribbon.

FIG. 4 shows an example of a cross-sectional schematic diagram of a passivated emitter and rear cell (also referred to as a "PERC cell"). The passivated emitter and rear cell shown in FIG. 4 has a back side passivation film 14 on the back side thereof. Electrical contact is made between the crystalline silicon substrate 1 and the back side full-surface electrodes 15b by punctate openings arranged in the back side passivation film 14. Furthermore, impurity diffusion portions 18 (p-type impurity diffusion portions) are arranged at those portions where the crystalline silicon substrate 1 and the back side electrodes 15b make contact. These impurity diffusion portions 18 are equivalent to the back surface field (BSF) of the typical crystalline silicon solar cell shown in FIG. 1. In the case of the passivated emitter and rear cell shown in FIG. 4, since nearly the entire surface of the back side is covered by the back side passivation film 14, surface defect density on the back side can be reduced. Consequently, in comparison with the solar cell shown in FIG. 1, the passivated emitter and rear cell shown in FIG. 4 is able to prevent carrier recombination caused by surface defects on the back side. Consequently, the passivated emitter and rear cell is able to obtain higher conversion efficiency than the solar cell shown in FIG. 1.

The passivated emitter rear cell shown in FIG. 4 has the light incident side bar electrodes 20a and finger electrodes 20b on the light incident side surface in the same manner as the typical crystalline silicon solar cell shown in FIG. 1, and has the back side TAB electrodes 15a and the back side full-surface electrodes 15b on the back side thereof.

FIG. 5 shows an example of a cross-sectional schematic diagram of a passivated emitter and rear cell in the vicinity of the light incident side bus bar electrodes 20a and back side TAB electrodes 15a. In the solar cell shown in FIG. 5, the back side passivation film 14 is arranged between the back side TAB electrodes 15a and the crystalline silicon substrate 1. If the back side TAB electrodes 15a end up firing through the back side passivation film 14, a large number of surface defects end up forming in the surface (interface) of the crystalline silicon substrate 1 at those portions where the back side TAB electrodes 15 have tired through. As a result, carrier recombination caused by surface defects in the back side increases, thereby resulting in a decrease in performance of the solar cell. Thus, the conductive paste for forming the back side TAB electrodes 15a is required to not completely fire through the back side passivation film 14 during firing. Thus, the conductive paste for forming the back side TAB electrodes 15a is required to have low fire-through properties (reactivity) with respect to the back side passivation film 14. Namely, the conductive paste for forming the back side TAB electrodes 15a of a passivated emitter and rear cell is at least required to not have a detrimental effect on the passivation film to an extent that affects the properties of the solar cell.

Furthermore, an interconnecting metal ribbon (for making an electrical connection between solar cells) is soldered to the hack side TAB electrodes 15a. Thus, the back side TAB electrodes 15a of a passivated emitter and rear cell are also required to demonstrate sufficiently high adhesive strength with respect to the back side passivation film 14.

In addition, soldering adhesive strength between the back side TAB electrodes 15a and interconnecting metal ribbon soldered to the back side TAB electrodes 15a is required to be sufficiently high in order to avoid disconnections between solar cells.

Furthermore, the conductive paste for forming the light incident side bus bar electrodes 20a may also be required to demonstrate performance similar to the performance required by conductive paste for forming the aforementioned back side TAB electrodes 15a. This is because the antireflective film 2 formed on the light incident side surface also functions as a passivation film of the light incident side surface.

The present invention is an invention conceived in order to satisfy the requirements of the back side TAB electrodes and light incident light bus bar electrodes of solar cells as previously described. Namely, an object of the present invention is to provide a conductive paste for forming bus bar electrodes having high adhesive strength with respect to a passivation film in a crystalline silicon solar cell without having a detrimental effect on the passivation film so as to affect solar cell properties.

More specifically, an object of the present invention is to provide a conductive paste for forming back side TAB electrodes having high adhesive strength with respect to a passivation film arranged on the back side of a passivated emitter and rear cell without having a detrimental effect on the passivation film so as to affect solar cell properties.

In addition, an object of the present invention is to provide a conductive paste for forming light incident side bus bar electrodes having high adhesive strength with respect to an antireflective film (passivation film) arranged on the light incident side surface in a crystalline silicon solar cell without having a detrimental effect on the antireflective film so as to affect solar cell properties.

In addition, an object of the present invention is to provide a crystalline silicon solar cell having bus bar electrodes having high adhesive strength with respect to a passivation film without having a detrimental effect on the passivation film so as to affect solar cell properties.

Means for Solving the Problems

The inventors of the present invention found that, by forming bus bar electrodes of a crystalline silicon solar cell using a conductive paste containing glass frit containing a prescribed amount of $TeO_2$, bus bar electrodes having high adhesive strength can be formed on a passivation film without having a detrimental effect on the passivation film, thereby leading to completion of the present invention. The present invention has the configurations indicated below in order to solve the aforementioned problems.

The present invention consists of a conductive paste as characterized by the following Configurations 1 to 9, and a solar cell as characterized by the following Configuration 10.

Configuration 1

Configuration 1 of the present invention is a conductive paste formed on a passivation film of a solar cell, containing:
(A) silver particles,
(B) an organic vehicle, and
(C) glass frit containing $TeO_2$ at 1.0 mol % to 20 mol % and $Bi_2O_3$ at 10 mol % to 30 mol %.

According to Configuration 1 of the present invention, a conductive paste can be obtained for forming bus bar electrodes having high adhesive strength with respect to a passivation film in a crystalline silicon solar cell without having a detrimental effect on the passivation film so as to affect solar cell properties. Namely, the conductive paste of Configuration 1 of the present invention can be preferably used as a conductive paste for forming back side TAB electrodes of a passivated emitter and rear cell and a conductive paste for forming light incident side bus bar electrodes of a crystalline silicon solar cell.

Configuration 1

Configuration 2 of the present invention is the conductive paste described in Configuration 1, wherein the specific surface area of the silver particles (A) is 0.4 $m^2/g$ to 1.5 $m^2/g$.

According to Configuration 2 of the present invention, as a result of making the specific surface area of the silver particles (A) contained in the conductive paste of the present invention to be 0.4 $m^2/g$ to 1.5 $m^2/g$, reactivity of the conductive paste to the passivation film can be inhibited during firing of the conductive paste. In addition, soldering adhesive strength of a metal ribbon to the resulting electrodes can be increased.

Configuration 3

Configuration 3 of the present invention is the conductive paste of Configuration 1 or Configuration 2, wherein the organic vehicle (B) contains at least one of ethyl cellulose, rosin ester, butyral, acrylic or organic solvent.

According to Configuration 3 of the present invention, as a result of the organic vehicle (B) of the conductive paste of the present invention containing at least one of ethyl cellulose, rosin ester, acrylic or organic solvent, screen printing of the conductive paste can be carried out favorably. In addition, the shape of the printed pattern can be made to have a suitable shape.

Configuration 4

Configuration 4 of the present invention is the conductive paste of any of Configurations 1 to 3, wherein the glass frit (C) further contains $SiO_2$ at 5 mol % to 30 mol %.

Configuration 5

Configuration 5 of the present invention is the conductive paste of any of Configurations 1 to 4, wherein the glass frit (C) further contains ZnO at 10 mol % to 30 mol %.

Configuration 6

Configuration 6 of the present invention is the conductive paste of any of Configurations 1 to 5, wherein the glass fit (C) further contains $Al_2O_3$ at 1 mol % to 10 mol %.

Configuration 7

Configuration 7 of the present invention is the conductive paste described in any of Configurations 1 to 6, wherein the glass frit (C) further contains $TiO_2$ at 1 mol % to 20 mol %.

Since $SiO_2$, ZnO, $Al_2O_3$ and $TiO_2$ are optional components, these components are not necessarily required to be contained in the glass frit (C). However, according to Configurations 4 to 7 of the present invention, as a result of the glass fit (C) contained in the conductive paste of the present invention further containing prescribed incorporated amounts of $SiO_2$, ZnO, $Al_2O_3$ and/or $TiO_2$, bus bar electrodes having high adhesive strength can be formed more reliably on a passivation film without having a detrimental effect on the passivation film during firing so as to affect solar cell properties.

Configuration 8

Configuration 8 of the present invention is the conductive paste of any of Configurations 1 to 7, containing at least one additive among titanium resinate, titanium oxide, cobalt oxide, cerium oxide, silicon nitride, copper-manganese-tin, aluminosilicate and aluminum silicate.

According to Configuration 8 of the present invention, as a result of the conductive paste of the present invention further containing at least one additive selected from titanium resinate, titanium oxide, cobalt oxide, cerium oxide, silicon nitride, copper-manganese-tin, aluminosilicate and aluminum silicate, adhesive strength of a solder ribbon to the passivation film can be improved. Moreover, as a result of further containing silicon nitride, reactivity of the conductive paste to the passivation film during firing can be controlled. As a result, detrimental effects on the passivation film that have an effect on solar cell properties can be prevented.

Configuration 9

Configuration 9 of the present invention is the conductive paste of any of Configurations 1 to 8, wherein the conductive paste is a conductive paste for forming back side TAB electrodes.

The use of the conductive paste of the present invention makes it possible to form electrodes of high adhesive strength on a passivation film without having a detrimental effect on the passivation film so as to affect solar cell properties. Consequently, the conductive paste of the present invention can be preferably used to form back side TAB electrodes of a passivated emitter and rear cell.

Configuration 10

Configuration 10 of the present invention is a solar cell in which electrodes are formed using the conductive paste of any of Configurations 1 to 9.

According to Configuration 10 of the present invention, a solar cell, and particularly a crystalline silicon solar cell, can be obtained that have bus bar electrodes having high adhesive strength with respect to a passivation film without having a detrimental effect on the passivation film so as to affect solar cell properties.

Effects of the Invention

According to the present invention, a conductive paste can be provided for forming bus bar electrodes having high adhesive strength with respect to a passivation film in a crystalline silicon solar cell without having a detrimental effect on the passivation film so as to affect solar cell properties.

More specifically, according to the present invention, a conductive paste can be provided for forming back side TAB electrodes having high adhesive strength with respect to a passivation film arranged on the back side in a passivated emitter and rear cell without having a detrimental effect on the passivation film so as to affect solar cell properties.

In addition, according to the present invention, a conductive paste can be provided for forming light incident side bus bar electrodes having high adhesive strength with respect to an antireflective film (passivation film) arranged on the light incident side surface in a crystalline silicon solar cell without having a detrimental effect on the antireflective film so as to affect solar cell properties.

In addition, according to the present invention, a crystalline silicon solar cell can be provided having bus bar electrodes having high adhesive strength with respect to a passivation film without having a detrimental effect on the passivation film so as to affect solar cell properties.

MODE FOR CARRYING OUT THE INVENTION

In the present description, "crystalline silicon" includes single crystal silicon and polycrystalline silicon. In addition, "crystalline silicon substrate" refers to a material molded into a shape suitable for forming a device, such as for forming crystalline silicon into the shape of a flat plate, for the purpose of forming an electrical element, electronic element or other semiconductor device. Any method may be used to produce the crystalline silicon. For example, the Czochralski method can be used in the case of single crystal silicon, and the casting method can be used in the case of polycrystalline silicon. In addition, polycrystalline silicon ribbon produced by another production method such as the ribbon growth method or polycrystalline ribbon formed on a substrate of a different material such as glass can also be used for the crystalline silicon substrate. In addition, "crystalline silicon solar cell" refers to a solar cell produced using a crystalline silicon substrate.

In the present description, glass frit refers to that consisting mainly of a plurality of types of oxides such as metal oxides and which is typically used in the form of glass-like particles.

The present invention is a conductive paste for forming electrodes formed on a passivation film of a solar cell. The conductive paste of the present invention contains (A) conductive particles, (B) an organic vehicle, and (C) glass frit. The glass frit contains 1.0 mol % to 20 mol % of $TeO_2$ and 10 mol % to 30 mol % of $Bi_2O_3$. Use of the conductive paste of the present invention makes it possible to form bus bar electrodes having high adhesive strength on a passivation film in a crystalline silicon solar cell without having a detrimental effect on the passivation film so as to affect solar cell properties.

Figure 4:
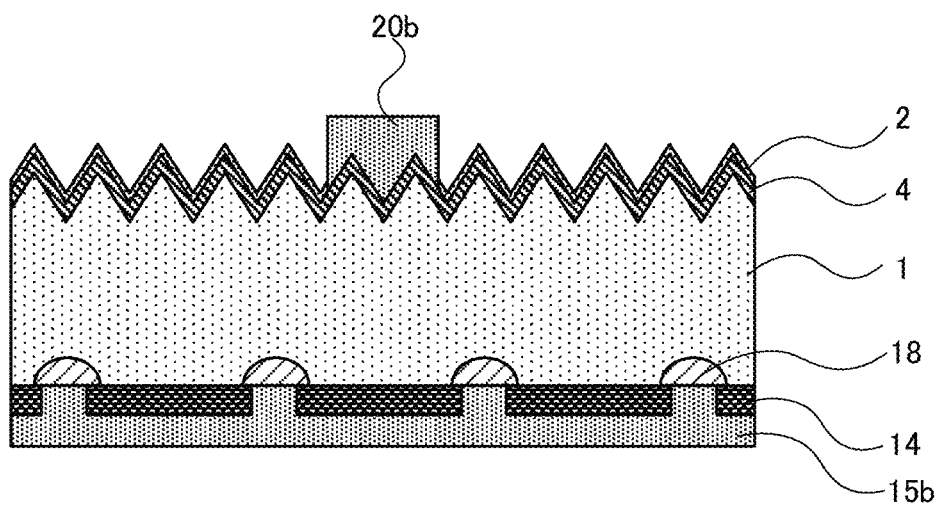
FIG. 4 is an example of a cross-sectional schematic diagram of a passivated emitter and rear cell in the vicinity where light incident side electrodes (light incident side finger electrodes) are present.
Figure 5:
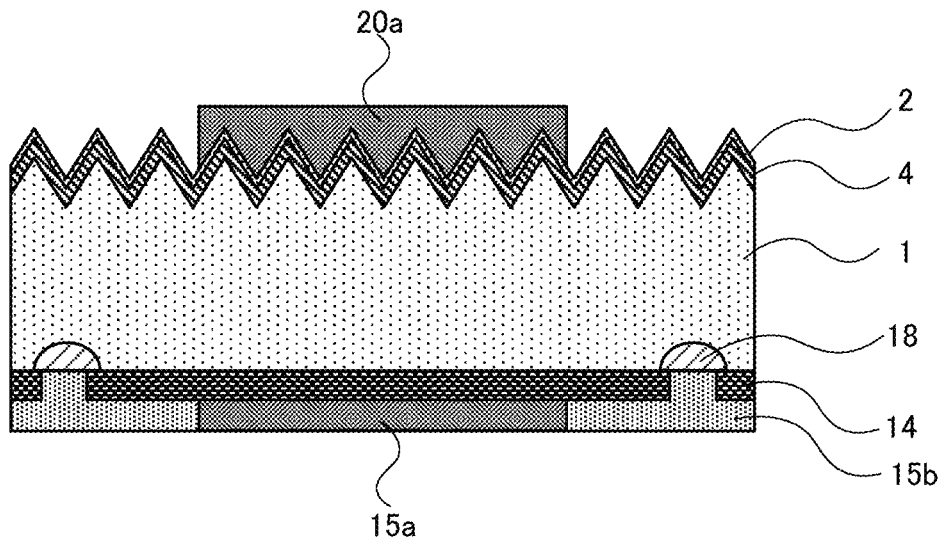
FIG. 5 is an example of a cross-sectional schematic diagram of a passivated emitter and rear cell in the vicinity where light incident side bus bar electrodes and back side TAB electrodes are present.

In the present description, a passivation film can be the back side passivation film 14 of a passivated emitter and rear cell as shown in FIGS. 4 and 5. Furthermore, the antireflective film 2 formed on the light incident side surface of a crystalline silicon solar cell, such as the typical solar cell shown in FIG. 1 or a passivated emitter and rear cell, has the function of a passivation film on the light incident side surface. Thus, in the present description, a "passivation film" refers to both the back side passivation film 14 of a passivated emitter and rear cell and the antireflective film 2 of a crystalline silicon solar cell.

The passivation film can be a film composed of a single layer or multiple layers. In the case the passivation film is composed of a single layer, it is preferably a thin film (SiN film) having silicon nitride (SiN) for the material thereof from the viewpoint of being able to effectively carry out passivation of the surface of a silicon substrate. In addition, in the case the passivation film is composed of multiple layers, it is preferably a laminated film composed of a film having silicon nitride for the material thereof and a film having silicon oxide for the material thereof ($SiN/SiO_2$ film). Furthermore, in the case the $SiN/SiO_2$ film is a passivation film, the $SiN/SiO_2$ film is preferably formed such that the $SiO_2$ film contacts the silicon substrate from the viewpoint of being able to effectively carry out passivation of the surface of the silicon substrate. Furthermore, the $SiO_2$ film can be a natural oxide film of the silicon substrate.

The solar cell electrodes able to be preferably formed by the conductive paste of the present invention are bus bar electrodes formed on a passivation film of a crystalline silicon solar cell. In the present description, the bus bar electrodes include light incident light electrodes 20a formed on the light incident side surface and back side TAB electrodes (back side bus bar electrodes) 15a formed on the back side. The light incident side bus bar electrodes 20a have the function of electrically connecting finger electrodes 20b for collecting current generated by the solar cell with an interconnecting metal ribbon. Similarly, the back side TAB electrodes 15a have the function of electrically connecting back side full-surface electrodes 15b for collecting current generated by the solar cell with an interconnecting metal ribbon. Thus, the bus bar electrodes (light incident side bus bar electrodes 20a and back side TAB electrodes 15a) are not required to contact the crystalline silicon substrate 1. On the contrary, if the bus bar electrodes end up contacting the crystalline silicon substrate 1, surface defect density of the surface (interface) of the crystalline silicon substrate 1 at the portion where the bus bar electrodes make contact ends up increasing and solar cell performance ends up decreasing. Use of the conductive paste of the present invention does not have a detrimental effect on a passivation film so as to affect solar cell properties. Namely, the conductive paste of the present invention does not completely fire through to the back side passivation film 14 due to the low fire-through properties (reactivity) with respect to the back side passivation film 14. Consequently, in the case of having formed bus bar electrodes using the conductive paste of the present invention, the passivation film at the portion that contacts the crystalline silicon substrate 1 can be maintained in its original state and increases in surface defect density caused by carrier recombination can be prevented.

Figure 1:
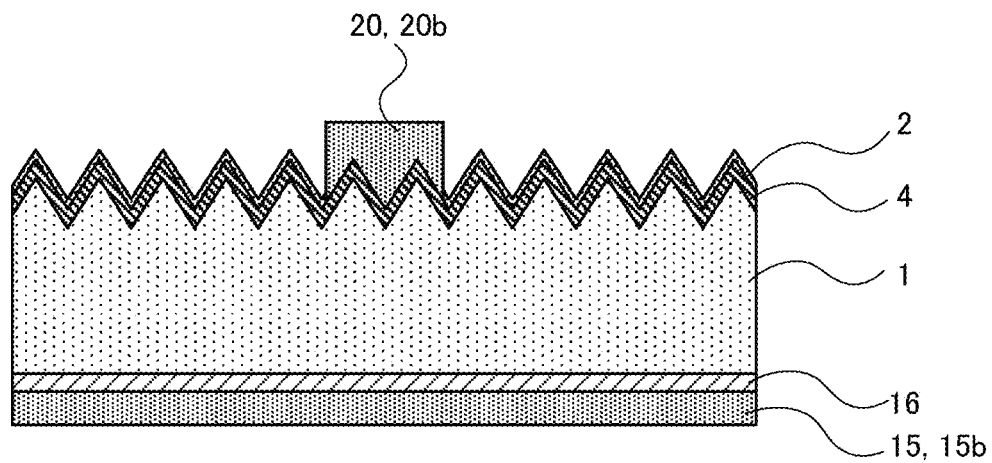
FIG. 1 is an example of a cross-sectional schematic diagram of a typical crystalline silicon solar cell in the vicinity where light incident side electrodes (finger electrodes) are present.
Figure 2:
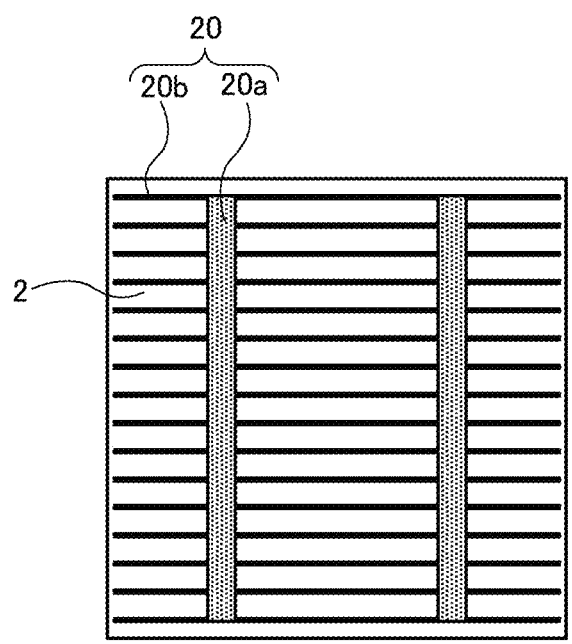
FIG. 2 is an example of a schematic diagram of the light incident side surface of a crystalline silicon solar cell.

Furthermore, as shown in FIGS. 1, 2 and 4, the finger electrodes 20b are arranged as light incident side electrodes 20 on the light incident side surface of a crystalline silicon solar cell. In the example shown in FIG. 2, electrons of the electron-hole pairs generated by incident light that has entered the crystalline silicon solar cell are collected in the finger electrodes 20b by way of an n-type impurity diffusion layer 4. Thus, contact resistance between the finger electrodes 20b and the n-type impurity diffusion layer 4 is required to be low. Moreover, the finger electrodes 20b are formed by printing a prescribed conductive paste onto the antireflective film 2 having titanium nitride and the like for the material thereof and firing the conductive paste through the antireflective film 2 during firing. Thus, differing from the conductive paste of the present invention, the conductive paste for forming the finger electrodes 20b is required to have performance enabling the conductive paste to fire through the antireflective film 2.

Furthermore, in the present description, electrodes for extracting current from the crystalline silicon solar cell to the outside in the form of the light incident side electrodes 20 and the back side electrodes 15 may be collectively referred to as "electrodes".

The following provides a detailed explanation of the conductive paste of the present invention.

The conductive paste of the present invention contains (A) conductive particles, (B) an organic vehicle, and (C) glass frit.

Silver particles (Ag particles) can be used for conductive particles contained in the conductive paste of the present invention. Furthermore, the conductive paste of the present invention can also contain metals other than silver, such as gold, copper, nickel, zinc and/or tin, within a range that does not impair the performance of the solar cell electrodes. However, the conductive particles are preferably silver particles composed of silver from the viewpoint of obtaining low electrical resistance and high reliability. Furthermore, a large number of silver particles (Ag particles) may also be referred to as silver powder (Ag powder). This applies similarly to other particles as well.

The particle size of the silver particles is preferably 0.5 μm to 2.5 μm. As a result of making the particle size of the silver particles to be within a prescribed range, reactivity of the conductive paste to the passivation film can be inhibited during firing of the conductive paste, and soldering adhesive strength of metal ribbon to the resulting electrodes can be increased. A spherical or scaly shape, for example, can be used for the shape of the silver particles.

In general, since the size of microparticles has a certain distribution, it is not necessary for all of the particles to have the aforementioned prescribed size. Particle size equivalent to 50% of the integral value of all particles (median diameter, D50) is preferably within the range of the aforementioned particle size. In the present description, median diameter (D50) is referred to as the mean particle diameter (D50). This applies similarly to the sizes of particles other than the silver particles that are described in the present description. Furthermore, mean particle diameter (D50) can be determined by measuring particle size distribution according to the micro-tracking method (laser diffraction scattering method) and obtaining the value of mean particle diameter (median diameter, D50) from the results of particle size distribution measurement. In the case of the conductive paste of the present invention, the mean particle diameter (D50) of the silver particles is preferably 0.5 μm to 2.5 μm.

In addition, the size of the silver particles can be expressed as BET specific surface area (also simply referred to as "specific surface area"). The BET value of the silver particles is preferably 0.4 m²/g to 1.5 m²/g and more preferably 0.7 m²/g to 1.2 m²/g. BET specific surface area can be measured using, for example, the Macsorb fully automated specific surface area measuring device (Mountech).

Next, an explanation is provided of the glass frit contained in the conductive paste of the present invention. The glass frit contained in the conductive paste of the present invention contains $TeO_2$ and $Bi_2O_3$.

The content of $TeO_2$ in the glass fit contained in the conductive paste of the present invention is 1.0 mol % to 20 mol %, preferably 1.0 mol % to 19 mol %, and more preferably 1.0 mol % to 18 mol %.

As a result of making the $TeO_2$ content in the glass frit to be within a prescribed range, reactivity of the conductive paste to a passivation film during firing of the conductive paste can be inhibited and adhesive strength of the resulting electrodes to a passivation film can be increased. In addition, due to the low temperature of the softening point of $TeO_2$, dense electrodes can be formed as a result of the glass frit in the conductive paste containing a prescribed amount of $TeO_2$.

The conductive paste of the present invention is such that the glass frit further contains $Bi_2O_3$ in addition to $TeO_2$. The content of $Bi_2O_3$ in the glass frit of the conductive paste of the present invention is 10 mol % to 30 mol %, preferably 12 mol % to 28 mol % and more preferably 15 mol % to 25 mol %. As a result of the conductive paste of the present invention containing a prescribed amount of $Bi_2O_3$ in addition to $TeO_2$, reactivity of the conductive paste to a passivation film during firing of the conductive paste can be more reliably inhibited and soldering adhesive strength of metal ribbon to the resulting electrodes can be more reliably increased. More specifically, in the case the content of $TeO_2$ is high, there is the possibility of firing through the passivation film. As a result of the glass frit further containing $Bi_2O_2$, the softening point of the $TeO_2$ can be adjusted. Thus, as a result of the glass frit further containing $Bi_2O_3$, fire-through of a passivation film can be controlled.

The conductive paste of the present invention is preferably such that the glass frit further contains $SiO_2$, ZnO and/or $Al_2O_3$ in addition to $TeO_2$ and $Bi_2O_3$.

The content of $SiO_2$ in the glass frit contained in the conductive paste of the present invention is preferably 5 mol % to 30 mol %, more preferably 10 mol % to 27 mol % and even more preferably 15 mol % to 25 mol %.

The content of ZnO in the glass frit contained in the conductive paste of the present invention is preferably 10 mol % to 30 mol % and more preferably 15 mol % to 27 mol %.

The content of $Al_2O_3$ in the glass fit contained in the conductive paste of the present invention is preferably 1 mol % to 10 mol % and more preferably 2 mol % to 7 mol %.

As a result of making the contents of $SiO_2$, ZnO and/or $Al_2O_3$ in the glass frit to be within prescribed ranges, bus bar electrodes having high adhesive strength can be more reliably formed on a passivation film during firing of the conductive paste without having a detrimental effect on the passivation film so as to affect solar cell properties.

The conductive paste of the present invention is preferably such that the glass fit further contains $TiO_2$ in addition to the aforementioned components. The content of $TiO_2$ in the glass fit contained in the conductive paste of the present invention is preferably 1 mol % to 20 mol %, more preferably 2 mol % to 10 mol % and even more preferably 3 mol % to 5 mol %. As a result of the glass frit containing $TiO_2$, bus bar electrodes having high adhesive strength can be more reliably formed on a passivation film when firing the conductive paste without having a detrimental effect on the passivation film so as to affect solar cell properties.

The glass frit of the conductive paste of the present invention can contain other oxides in addition to the aforementioned oxides, Examples of other oxides include $B_2O_3$, $WO_3$, BaO, $Ag_2O$ and $MoO_3$. In addition, the conductive paste of the present invention can contain other oxide components within a content range that does not impair the effects of the present invention.

The glass frit of the conductive paste of the present invention contains prescribed contents of $TeO_2$ and $Bi_2O_3$. In addition, the glass frit preferably further contains prescribed amounts of $SiO_2$, ZnO and $Al_2O_3$ in addition to these oxides. In addition, the glass fit preferably further contains a prescribed amount of $TiO_2$ in addition to these oxides. Use of a conductive paste containing glass frit containing such components makes it possible to form bus bar electrodes having high adhesive strength on a passivation film more reliably during firing of the conductive paste without having a detrimental effect on the passivation film so as to affect solar cell properties.

The conductive paste of the present invention contains 0.3 parts by weight to 3 parts by weight, preferably 0.5 parts by weight to 1.7 parts by weight and even more preferably 0.8 parts by weight to 1.6 parts by weight of the aforementioned glass fit based on 100 parts by weight of the silver particles. As a result of making the content of glass frit relative to the amount of silver particles to be within a prescribed range, bus bar electrodes having high adhesive strength can be formed on a passivation film in a crystalline silicon solar cell without having a detrimental effect on the passivation film so as to affect solar cell properties.

There are no particular limitations on the shape of the glass frit particles, and those having a spherical shape or irregular shape and the like can be used. In addition, there are also no particular limitations on particle size. From the viewpoint of workability and so forth, the mean particle diameter (D50) of the particles is preferably within the range of 0.1 μm to 10 μm and more preferably within the range of 0.5 μm to 5 μm.

One type of particle respectively containing prescribed amounts of the required plurality of oxides can be used for the glass frit particles. In addition, particles consisting of a single oxide can be used as different particles for each of the required plurality of oxides. In addition, a plurality of types of particles having different compositions of the required plurality of oxides can also be used in combination.

In order to allow the glass frit to demonstrate proper softening performance during firing of the combustion paste of the present invention, the softening point of the glass frit is preferably 200° C. to 700° C., more preferably 300° C. to 600° C. and even more preferably 320° C. to 580° C. The softening point of the glass fit can be measured using a thermogravimetric apparatus (such as TG-DTA2000SA manufactured by Bruker AXS). More specifically, the softening point of the glass fit can be determined by measuring using a thermogravimetric apparatus and using the temperature of the third inflection point from the low temperature side of the resulting curve.

The conductive paste of the present invention contains an organic vehicle. An organic binder and solvent can be contained for the organic vehicle. The organic binder and solvent fulfill the role of, for example, adjusting the viscosity of the conductive paste and there are no particular limitations thereon. The organic binder can also be used by dissolving in the solvent.

An organic binder selected from cellulose-based resin (such as ethyl cellulose or nitrocellulose) and (meth)acrylate resin (such as polymethyl acrylate or polymethyl methacrylate) can be used for the organic binder. The organic vehicle contained in the conductive paste of the present invention preferably contains at least one type selected from ethyl cellulose, rosin ester, butyral, acrylic and organic solvent. The added amount of organic binder is normally 0.2 parts by weight to 30 parts by weight and preferably 0.4 parts by weight to 5 parts by weight based on 100 parts by weight of the silver particles.

One type or two or more types of solvents selected from alcohols (such as terpineol, α-terpineol or β-terpineol) and esters (such as hydroxyl group-containing esters, 2,2,4-trimethyl-1,3-pentanediol monoisobutyrate or butyl carbitol acetate) can be used for the solvent. The added amount of solvent is normally 0.5 parts by weight to 30 parts by weight and preferably 5 parts by weight to 25 parts by weight based on 100 parts by weight of the silver particles.

Moreover, additives selected from plasticizers, antifoaming agents, dispersants, leveling agents, stabilizers and adhesion promoters can be incorporated as additives in the conductive paste of the present invention as necessary. Among these, plasticizers selected from phthalic acid esters, glycolic acid esters, phosphoric acid esters, sebacic acid esters, adipic acid esters and citric acid esters can be used as plasticizers.

The conductive paste of the present invention can also contain additives other than those described above within a range that does not have a detrimental effect on the solar cell properties of the resulting solar cell. For example, the conductive paste of the present invention can further contain at least one type of additive selected from titanium resinate, titanium oxide, cobalt oxide, cerium oxide, silicon nitride, copper-manganese-tin, aluminosilicate and aluminum silicate. As a result of containing these additives, adhesive strength of solder ribbon to a passivation film can be improved. These additives can be in the form of particles (additive particles). The added amount of additive based on 100 parts by weight of the silver particles is preferably 0.01 parts by weight to 5 parts by weight and more preferably 0.05 parts by weight to 2 parts by weight. The additive is preferably copper-manganese-tin, aluminosilicate or aluminum silicate in order to obtain higher adhesive strength. The additive can contain both aluminosilicate and aluminum silicate.

Next, an explanation is provided of a method for producing the conductive paste of the present invention. The conductive paste of the present invention can be produced by adding silver particles, glass frit and other additives as necessary to an organic binder and solvent followed by mixing and dispersing therein.

Mixing can be carried out with, for example, a planetary mixer. In addition, dispersion can be carried out with a three roll mill. Mixing and dispersion are not limited to these methods, but rather can be carried out using various other known methods.

Next, an explanation is provided of the solar cell of the present invention. The present invention is a solar cell having electrodes formed using the aforementioned conductive paste.

Figure 3:
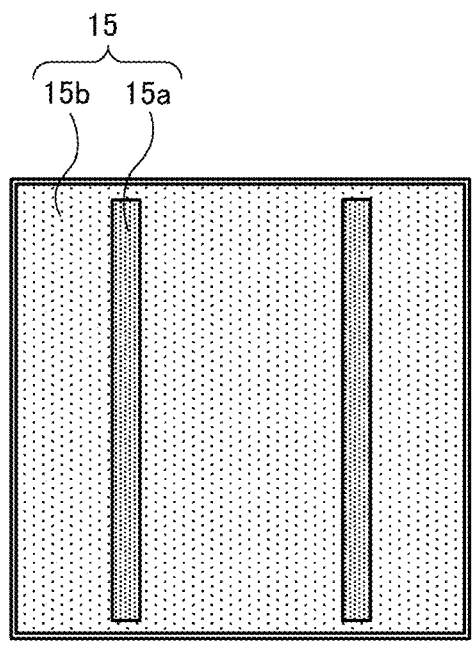
FIG. 3 is an example of a schematic diagram of the back side of a crystalline silicon solar cell.

FIG. 1 shows a cross-sectional schematic diagram of a typical crystalline silicon solar cell having electrodes on both the light incident side and back side (light incident side electrodes 20 and back side electrodes 15) in the vicinity of a light incident side electrode 20. The crystalline silicon solar cell shown in FIG. 1 has light incident side electrodes 20 formed on the light incident side, an antireflective film 2, and n-type impurity diffusion layer (n-type silicon layer) 4, a p-type crystalline silicon substrate 1 and back side electrodes 15. In addition, FIG. 2 shows an example of a schematic diagram of the light incident side surface of a typical crystalline silicon solar cell. FIG. 3 shows an example of a schematic diagram of the back side of a typical crystalline silicon solar cell. In the typical crystalline silicon solar cell shown in FIG. 1, use of the conductive paste of the present invention to form light incident side bus bar electrodes 20a on the light incident surface makes it possible to obtain the light incident side bus bar electrodes 20a without having a detrimental effect on the passivation film (antireflective film 2).

The typical crystalline silicon solar cell shown in FIG. 1 can have back side electrodes 15 employing the structure shown in FIG. 3. As shown in FIG. 3, the back side electrodes 15 typically include back side full-surface electrodes 15b containing aluminum and back side TAB electrodes 15a electrically connected to the back side full-surface electrodes 15b.

Furthermore, since the back side passivation film 14 is not present in the case of the typical crystalline silicon solar cell shown in FIG. 1, the effect of the conductive paste of the present invention of "forming electrodes so as not to have a detrimental effect on the passivation film" cannot be demonstrated even if the back side TAB electrodes 15a are formed using the conductive paste of the present invention. However, since use of the conductive paste of the present invention makes it possible to form the back side TAB electrodes 15a so as to have sufficiently high soldering adhesive strength with respect to metal ribbon, even in the case of the typical solar cell shown in FIG. 1, the conductive paste of the present invention can be used to form the back side TAB electrodes 15a.

FIGS. 4 and 5 show an example of a cross-sectional schematic diagram of a passivated emitter and rear cell. The passivated emitter and rear cell shown in FIG. 4 has the back side passivation film 14 on the back side thereof. FIG. 5 shows an example of a cross-sectional schematic diagram of a passivated emitter and rear cell in the vicinity of the light incident side bus bar electrodes 20a and back side TAB electrodes 15a. In the passivated emitter and rear cell shown in FIG. 5, as a result of forming the light incident side bus bar electrodes 20a on the light incident side surface and the back side TAB electrodes 15a arranged on the back side using the conductive paste of the present invention, there is no detrimental effect on the passivation films (antireflective film 2 and back side passivation film 14).

Thus, the aforementioned conductive paste of the present invention can be preferably used as a conductive paste for forming the bus bar electrodes of a crystalline silicon solar cell. In addition, the conductive paste of the present invention can be particularly preferably used as a conductive paste for the back side TAB electrodes of a passivated emitter and rear cell.

The typical crystalline silicon solar cell shown in FIG. 1 and the passivated emitter and rear cell shown in FIG. 4 contain the light incident side bus bar electrodes 20a shown in FIG. 2 and the back side TAB electrodes 15a shown in FIG. 3. An interconnecting metal ribbon, the periphery of which is covered with solder, is soldered to the light incident side bus bar electrodes 20a and the back side TAB electrodes 15a. Current generated by the solar cell is led outside the crystalline silicon solar cell by this metal ribbon. Use of the conductive paste of the present invention makes it possible to form the light incident side bus bar electrodes 20a and the back side TAB electrodes 15a having sufficiently high soldering adhesive strength with the metal ribbon.

The width of the bus bar electrodes (light incident side bus bar electrodes 20a and back side TAB electrodes 15a) can be roughly the same width as the interconnecting metal ribbon. Since the bus bar electrodes have low electrical resistance, the bus bar electrodes preferably have a wide width. On the other hand, the width of the light incident side bus bar electrodes 20a is preferably narrow in order to increase the incident area of light relative to the light incident side surface. Consequently, bus bar electrode width is 0.5 mm to 5 mm, preferably 0.8 mm to 3 mm, and more preferably 1 mm to 2 mm. In addition, the number of bus bar electrodes can be determined corresponding to the size of the crystalline silicon solar cell. More specifically, the number of bus bar electrodes can be 1, 2, 3 or 4. The optimum number of bus bar electrodes can be determined so as to maximize conversion efficiency of the crystalline silicon solar cell by simulating solar cell operation. Furthermore, since crystalline silicon solar cells are mutually connected in series by the interconnecting metal ribbon, the numbers of light incident side bus bar electrodes 20a and back side TAB electrodes 15a are preferably equal. The widths of the light incident side bus bar electrodes 20a and the back side TAB electrodes 15a are preferably equal for the same reason.

The area occupied by the light incident side electrodes 20 on the light incident side surface is preferably as small as possible in order to increase the incident area of light relative to the crystalline silicon solar cell. Consequently, the width of the finger electrodes 20b on the light incident side surface is preferably as narrow as possible and the number thereof is preferably as small as possible. On the other hand, the finger electrodes 20b are preferably wide and the number thereof is preferably large from the viewpoint of reducing electrical loss (ohmic loss). In addition, the finger electrodes 20b are preferably wide from the viewpoint of decreasing contact resistance between the finger electrodes 20b and the crystalline silicon substrate 1 (impurity diffusion layer 4). On the basis of the above, the width of the finger electrodes 20b can be 30 μm to 300 μm, preferably 50 μm to 200 μm, and more preferably 60 μm to 150 μm. In addition, the number of bus bar electrodes can be determined corresponding to the size of the crystalline silicon solar cell and the width of the bus bar electrodes. The optimum width and number of finger electrodes 20b (interval between the finger electrodes 20b) can be determined so as to maximize conversion efficiency of the crystalline silicon solar cell by simulating solar cell operation.

Next, an explanation is provided of a method for producing the crystalline silicon solar cell of the present invention.

The method for producing the solar cell of the present invention includes a step for forming bus bar electrodes by printing the aforementioned conductive paste on the impurity diffusion layer 4 of the crystalline silicon substrate 1 or on the antireflective film 2 on the impurity diffusion layer 4 followed by drying and firing. The following provides a more detailed explanation of the method for producing the solar cell of the present invention.

The method for producing the crystalline silicon solar cell of the present invention includes a step for preparing a single conductivity type (p-type or n-type) of crystalline silicon substrate 1. A p-type crystalline silicon substrate can be used for the crystalline silicon substrate 1.

Furthermore, the surface on the light incident side of the crystalline silicon substrate 1 preferably has a pyramid-like textured structure from the viewpoint of obtaining high conversion efficiency.

Next, the method for producing the crystalline silicon solar cell of the present invention includes a step for forming an impurity diffusion layer 4 of another conductivity type on one surface of the crystalline silicon substrate 1 prepared in the aforementioned step. For example, in the case a p-type crystalline silicon substrate 1 is used for the crystalline silicon substrate 1, an n-type impurity diffusion layer having an n-type impurity of P (phosphorous) diffused therein can be formed for the impurity diffusion layer 4. Furthermore, a crystalline silicon solar cell can also be produced using an n-type crystalline silicon substrate. In that case, a p-type impurity diffusion layer is formed for the impurity diffusion layer.

When forming the impurity diffusion layer 4, the impurity diffusion layer 4 can be formed so that the sheet resistance thereof is 40 Ω/□ (Ω/square) to 150 Ω/□ and preferably 45 Ω/□ to 120 Ω/□.

In addition, in the method for producing the crystalline silicon solar cell of the present invention, the depth at which the impurity diffusion layer 4 is formed can be 0.3 μm to 1.0 μm. Furthermore, the depth of the impurity diffusion layer 4 refers to the depth from the surface of the impurity diffusion layer 4 to the p-n junction. The depth of the p-n junction can be taken to be the depth from the surface of the impurity diffusion layer 4 to the location where the impurity concentration in the impurity diffusion layer 4 reaches the impurity concentration of the substrate.

Next, the method for producing the crystalline silicon solar cell of the present invention includes a step for forming the antireflective film 2 on the surface of the impurity diffusion layer 4 formed in the aforementioned step. A silicon nitride film (SiN film) can be formed for the antireflective film 2. In the case of using a silicon nitride film for the antireflective film 2, the layer containing the silicon nitride film also has the function of a front side passivation film. Consequently, in the case of using a silicon nitride film for the antireflective film 2, a high-performance crystalline silicon solar cell can be obtained. In addition, as a result of the antireflective film 2 being a silicon nitride film, an antireflection function can be demonstrated with respect to incident light. The silicon nitride film can be deposited by a method such as plasma-enhanced chemical vapor deposition (PECVD).

Furthermore, in the case of producing the passivated emitter and rear cell shown in FIG. 4, a back side passivation film 14 such as silicon nitride film is formed on the back side thereof. The back side passivation film 14 has punctate openings formed by prescribed patterning for the purpose of electrical connection between the crystalline silicon substrate 1 and the back side full-surface electrodes 15b. Punctate openings are preferably not formed at those portions where the back side TAB electrodes 15a are formed.

The method for producing the crystalline silicon solar cell of the present invention includes a step for forming the light incident side electrodes 20 by printing a conductive paste on the surface of the antireflective film 2 and firing. In addition, the method for producing the crystalline silicon solar cell of the present invention further includes a step for forming the back side electrodes 15 by printing a conductive paste on the other surface (back side) of the crystalline silicon substrate 1 and firing.

More specifically, a pattern of the light incident side electrodes 20 printed using a prescribed conductive paste is first dried at a temperature of about 100° C. to 150° C. for several minutes (such as 0.5 minutes to 5 minutes). Furthermore, the light incident side bus bar electrodes 20a of the pattern of light incident side electrodes 20 are preferably formed using the conductive paste of the present invention at this time.

This is because there is no detrimental effect on the passivation film in the form of the antireflection film 2 in the case of forming the light incident side bus bar electrodes 20a using the conductive paste of the present invention. A known conductive paste for forming light incident side electrodes can be used to form the light incident side finger electrodes 20b.

After having printed and dried the pattern of light incident side electrodes 20, a prescribed conductive paste for forming the back side TAB electrodes 15a and a prescribed conductive paste for forming the back side full-surface electrodes 15b on the back side are also printed and dried on the back side in order to form the back side electrodes 15. As was previously described, the conductive paste of the present invention can be preferably used to form the back side TAB electrodes 15a of a passivated emitter and rear cell.

Subsequently, the printed conductive paste that has been dried is fired in air under prescribed firing conditions using a tubular furnace or other firing furnace. Firing conditions consist of using air for the firing atmosphere and a firing temperature of preferably 500° C. to 1000° C., more preferably 600° C. to 1000° C., even more preferably 500° C. to 900° C. and particularly preferably 700° C. to 900° C. Firing is preferably carried out in a short period of time, and the temperature profile (temperature vs. time curve) during firing is preferably in the shape of a peak. For example, firing is carried out using the aforementioned temperatures for the peak temperature at a firing oven in-out time of 10 seconds to 60 seconds and preferably 20 seconds to 40 seconds.

During firing, the conductive pastes for forming the light incident side electrodes 20 and the back side electrodes 15 are preferably fired simultaneously so that both electrodes are formed simultaneously. By printing a prescribed conductive paste on the light incident side and back side and simultaneously firing in this manner, firing for forming the electrodes is only required to be carried out once. Consequently, the crystalline silicon solar cell can be produced at lower cost.

The crystalline silicon solar cell of the present invention can be produced in the manner described above.

In the method for producing the crystalline silicon solar cell of the present invention, a conductive paste for forming the finger electrodes 20b preferably fires through the anti-reflective film 2 when firing the conductive paste printed on the light incident side surface of the crystalline silicon substrate 1 for forming the light incident side electrodes 20, and particularly when firing the conductive paste for forming the finger electrodes 20b. The finger electrodes 20b can thereby be formed so as to contact the impurity diffusion layer 4. As a result, contact resistance between the finger electrodes 20b and the impurity diffusion layer 4 can be reduced. The conductive paste for forming the light incident side electrodes 20, including the finger electrodes 20b, is known.

A solar cell module can be obtained by electrically connecting crystalline silicon solar cells of the present invention obtained in the manner described above with interconnecting metal ribbon and laminating with a glass plate, sealant and protective sheet and the like. A metal ribbon (such as a ribbon having copper for the material thereof) having a periphery covered with solder can be used for the interconnecting metal ribbon. Commercially available solder such as that composed mainly of tin, and more specifically, leaded solder containing lead and lead-free solder, can be used for the solder.

In the crystalline silicon solar cell of the present invention, a high-performance crystalline silicon solar cell can be provided by forming prescribed bus bar electrodes using the conductive paste of the present invention.

EXAMPLES

Although the following provides a detailed explanation of the present invention through examples thereof, the present invention is not limited to these examples.

In the examples and comparative examples, using a measuring substrate simulating a single crystal silicon solar cell; a soldering adhesive strength test of the interconnecting metal ribbon was carried out and the degree of deterioration of the passivation film was evaluated by photoluminescence (PL) imaging to evaluate the performance of the conductive pastes of examples and comparative examples of the present invention.

Materials and Formulation Ratios of Conductive Pastes

Compositions of the conductive pastes used to produce the solar cells of the examples and comparative examples were as indicated below.

(A) Silver Particles

The shape of the silver particles (100 parts by weight) used in Examples 1 to 23 and Comparative Examples 1 to 3 was spherical. BET specific surface areas of the silver particles are shown in Tables 1 to 6. The Macsorb fully automated specific surface area measuring device (Mountech) was used to measure BET specific surface area. BET specific surface area was measured according to the single-point BET method by adsorption of nitrogen gas after pre-drying at 100° C. and allowing nitrogen gas to flow through for 10 minutes.

(B) Glass Frit

Glass fit having the formulations shown in Tables 1 to 6 was used in Examples 1 to 23 and Comparative Examples 1 to 3, respectively. The added amounts of glass frit in the conductive pastes of the examples and comparative examples based on 100 parts by weight of the silver particles were as shown in Tables 1 to 6. Furthermore, the mean particle diameter (D50) of the glass frit was 2 μm. Mean particle diameter (D50) was determined by measuring particle size distribution using the micro-track method (laser diffraction scattering method) and obtaining the value of median diameter (D50) from the results of particle size distribution measurement. This applies similarly to the mean particle diameters (D50) of other particles as well.

The softening points of the glass frit of Examples 1 to 23 and Comparative Examples 1 to 3 were also measured. Measured values for softening point are shown in Tables 1 to 6. The softening points of the glass frit were measured using a thermogravimetric apparatus (such as TG-DTA2000SA manufactured by Bruker AXS). The temperature of the third inflection point from the low temperature side of the resulting thermogravimetric curve was taken to be the softening point.

The glass frit was produced in the manner indicated below. Namely, powders of the oxides serving as raw materials were first weighed and mixed and then placed in a crucible. This crucible was placed in a heated oven and the temperature of the contents of the crucible was raised to the melt temperature followed by maintaining at the melt temperature until the raw materials sufficiently melted. Next, the crucible was removed from the oven, the molten contents were stirred uniformly, and the contents of the crucible were quenched at room temperature using two stainless steel rollers to obtain a glass plate. Finally, the glass plate was uniformly dispersed while crushing with a pestle and then sized with a mesh sieve to be able to obtain glass frit having a desired particle size. Glass frit having a mean particle diameter (D50) of 149 μm was able to be obtained by passing the glass frit through a 100 mesh sieve followed by sizing the remainder present on a 200 mesh sieve. Moreover, glass frit having a mean particle diameter (D50) of 2 μm was able to be obtained by additionally crushing this glass frit.

(C) Organic Binder

Ethyl cellulose (1 part by weight) having an ethoxy content of 48% by weight to 49.5% by weight was used for the organic binder.

(D) Solvent

Butyl carbitol acetate (11 parts by weight) was used for the solvent.

Next, the materials having the aforementioned formulation ratios were mixed with a planetary mixer and further dispersed with a three roll mill to form pastes and prepare conductive pastes.

Measurement of Soldering Adhesive Strength

In one evaluation of the conductive paste of the present invention, substrates for measuring soldering adhesive strength that simulated solar cells were trial-produced using the prepared conductive pastes followed by measurement of soldering adhesive strength. Furthermore, in the tests for measuring soldering adhesive strength, both adhesive strength between the measuring substrate containing the passivation film and electrodes along with adhesive strength between the metal ribbon and electrodes were measured. Since the metal particles contained in the electrodes were Ag particles, adhesive strength between the metal ribbon and electrodes was comparatively high. Thus, measuring soldering adhesive strength made it possible to measure adhesive strength between the measuring substrate containing the passivation film and the electrodes.

The method used to trial-produce the measuring substrates was as indicated below.

A p-type single crystal silicon substrate (substrate thickness: 200 µm) used for the substrate.

First, after having formed a silicon oxide layer at a thickness of about 20 µm on the aforementioned substrate by dry oxidation, the substrate was etched with a solution obtained by mixing hydrogen fluoride, pure water and ammonium fluoride to remove any damage on the substrate surface. Moreover, the substrate was subjected to heavy metal cleaning with an aqueous solution containing hydrochloric acid and hydrogen peroxide.

Furthermore, when measuring adhesive strength of the back side TAB electrodes 15a, it is not necessary to form a textured structure, n-type impurity diffusion layer, antireflective film 2 or light incident side electrodes 20 on the light incident side surface. Thus, compositions thereof, which ought to have been formed on the light incident side surface during actual solar cell production, were not formed.

Next, the back side passivation film 14 in the form of a silicon nitride film was formed at a thickness of about 60 nm over the entire surface of the back side of the substrate by plasma CVD using silane gas and ammonia gas. More specifically, a silicon nitride film (back side passivation film 14) having a thickness of about 60 nm was formed by plasma CVD by glow discharge decomposition of a mixed gas consisting of a mixture of $NH_3$ and $SiH_4$ mixed at a ratio $NH_3/SiH_4$ of 0.5 and pressure of 1 torr (133 Pa).

The solar cell substrate obtained in this manner was used after cutting into squares measuring 15 mm×15 mm.

Printing of conductive paste for forming the back side TAB electrodes 15a was carried out by screen printing. Conductive pastes were used in the examples and comparative examples that contained glass frit and silver particles as shown in Tables 1 to 6, and patterns of the back side TAB electrodes 15a having a length of 1.3 mm and width of 2 mm were printed on the back side passivation film 14 of the aforementioned substrate so that the film thickness was about 20 µm. Subsequently, the printed patterns were dried for about one minute at 150° C.

Furthermore, the light incident side electrodes 20 are not required during measurement of the adhesive strength of the back side TAB electrodes 15a. Thus, the light incident side electrodes 20 were not formed.

The substrates having conductive pastes printed on the surface thereof in the manner described above were fired in air under prescribed firing conditions using a near infrared firing oven (NGK Insulators, Ltd., Solar Cell Rapid Firing Test Kiln) using a halogen lamp for the heat source. Firing conditions consisted of firing in air at a peak temperature of 775° C. and firing oven in-out time of 30 seconds. Substrates for measuring soldering adhesive strength were produced in the manner described above.

Samples for measuring adhesive strength of the soldered metal ribbons were fabricated and measured in the manner indicated below. An interconnecting metal ribbon in the form of copper ribbon (width: 1.5 mm× total thickness: 0.16 mm, covered with eutectic solder (weight ratio of tin: lead=64:36) at a film thickness of about 40 µm) was soldered to the back side TAB electrodes 15a of the aforementioned square substrate for measuring soldering adhesive strength measuring 15 mm on a side using flux at a temperature of 250° C. for 3 seconds to obtain a sample for measuring adhesive strength. Subsequently, the ring-shaped portion provided on one end of the ribbon was pulled in a direction 90 degrees relative to the substrate surface with a digital tension gauge (A&D Co., Ltd., Digital Force Gauge Model AD-4932-50N) followed by measuring soldering adhesive strength by measuring adhesive fracture strength. Furthermore, 10 samples were fabricated and the measured value was determined by taking the average of the 10 samples. Furthermore, in the case adhesive strength of the metal ribbon was greater than 1.5 N/mm, the sample can be said to have favorable adhesive strength capable of adequately withstanding use.

Evaluation of Reactivity of Conductive Paste to Passivation Film

Reactivity of conductive paste to passivation film was evaluated by the photoluminescence (PL) method (PL method). The PL method can be used to evaluate the reactivity of conductive paste to a passivation film in a non-destructive and non-contact manner and in a short period of time. More specifically, the PL method consists of irradiating a sample with light having energy greater than the band gap to cause the sample to emit light followed by evaluating the state of crystal defects as well as surface and interface defects based on the status of the emitted light. In the case the sample has defects and surface/interface defects in the single crystal silicon substrate, the defects act as recombination center of electron-hole pairs generated as a result of being irradiated with light, resulting in a corresponding decrease in band-edge emission intensity attributable to photoluminescence. In other words, in the case the passivation film has been eroded by the printed fired electrodes and surface defects have formed at the interface between the passivation film and the single crystal silicon substrate (namely, surface of the single crystal silicon substrate), the emission intensity of photoluminescence decreases at those portions where surface defects have formed (namely, those portions where electrodes have been formed on the sample). The magnitude of this photoluminescence emission intensity can be used to evaluate reactivity of a trial-produced conductive paste to a passivation film.

Measuring substrates for evaluating according to the PL method were trial-produced in the same manner as in the case of measuring soldering adhesive strength. Namely, measuring substrates having a silicon nitride film (back side passivation film 14) formed to a film thickness of about 60 µm on the back side of a single crystal silicon substrate and cut into squares measuring 15 mm×15 mm were used for the measuring substrates.

Printing of conductive paste for forming the back side TAB electrodes 15a was carried out by screen printing. Conductive pastes were used in the examples and comparative examples that contained glass frit and aforementioned silver particles as shown in Tables 1 to 6. Patterns of the back side TAB electrodes 15a having a width of 2 mm were printed on the back side passivation film 14 of the aforementioned substrate using a prescribed conductive paste so that the film thickness was about 20 μm followed by drying the printed patterns for about one minute at 150° C. Furthermore, the shape of the back side TAB electrodes 15*a* in the lengthwise direction was such that six electrodes having a length of 15 mm were arranged linearly (punctate pattern) in the vertical direction at intervals of 15 mm.

Furthermore, the light incident side electrodes 20 are not required during measurement of the back side TAB electrodes 15*a* according to the PL method. Thus, the light incident side electrodes 20 were not formed.

The substrates having an electrode pattern printed on the surface thereof with conductive paste as described above were fired in air under prescribed conditions using a near infrared firing oven (NGK Insulators, Ltd., Fuel Cell Rapid Firing Test Kiln) using a halogen lamp for the heat source. Firing conditions consisted of firing in air at a peak temperature of 775° C. and firing oven in-out time of 30 seconds. Substrates for measuring according to the PL method were produced in the manner described above.

The Photoluminescence Imaging System manufactured by BT Imaging Pty. Ltd. (Model LIS-R2) was used for PL measurement. Samples were irradiated with light from an excitation light source (wavelength: 650 nm, output: 3 mW) to obtain images of the emission intensity of photoluminescence.

Figure 6:
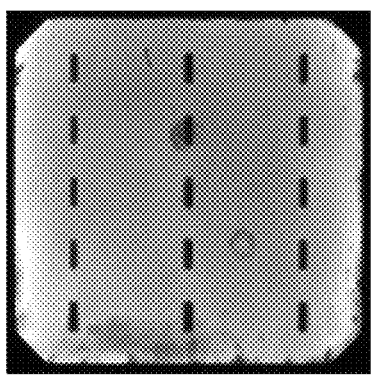
FIG. 6 is an image of the emission intensity of the photoluminescence of a sample of a back side TAB electrode produced using a conductive paste having reactivity to a passivation film as measured by photoluminescence (PL) imaging.
Figure 7:
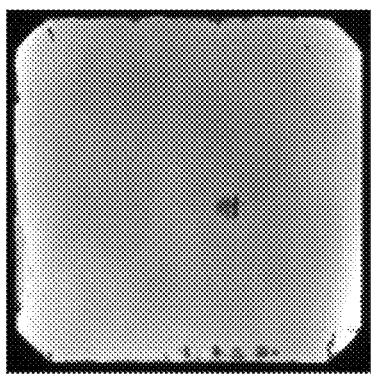
FIG. 7 is an image of the emission intensity of the photoluminescence of a sample of a back side TAB electrode produced using a conductive paste not having reactivity to a passivation film as measured by photoluminescence (PL) imaging.

FIGS. 6 and 7 indicate images of the emission intensity of photoluminescence as measured according to the PL method. A conductive paste ordinarily used to form light incident side electrodes (namely, a conductive paste capable of firing through a passivation film) was used to fabricate the sample shown in FIG. 6. As is clear from FIG. 6, images of those portions where the back side TAB electrodes 15*a* are formed appear dark. This indicates that the emission intensity of photoluminescence of the portions where the back side TAB electrodes 15*a* are formed has decreased. Thus, in the case of the sample shown in FIG. 6, as a result of having formed the back side TAB electrodes 15*a*, the passivation function attributable to the passivation film was impaired and surface defect density on the surface of the single crystal silicon substrate can be said to have increased. In Tables 1 to 6, the term "Present" is indicated in the column entitled "Reactivity of conductive paste to passivation film" for samples in which a decrease in photoluminescence emission intensity was observed in this manner. In addition, in the case of the sample shown in FIG. 7, a decrease in the emission intensity of photoluminescence was not observed. The term "Absent" is indicated in the column entitled "Reactivity of conductive paste to passivation film" for samples in which a decrease in photoluminescence emission intensity was not observed in this manner. In the case of forming the back side TAB electrodes 15*a* using a conductive paste for which "Reactivity of conductive paste to passivation film" was judged to be "Present", the conductive paste can be said to have a detrimental effect on the passivation film so as to affect solar cell properties.

Figure 8:
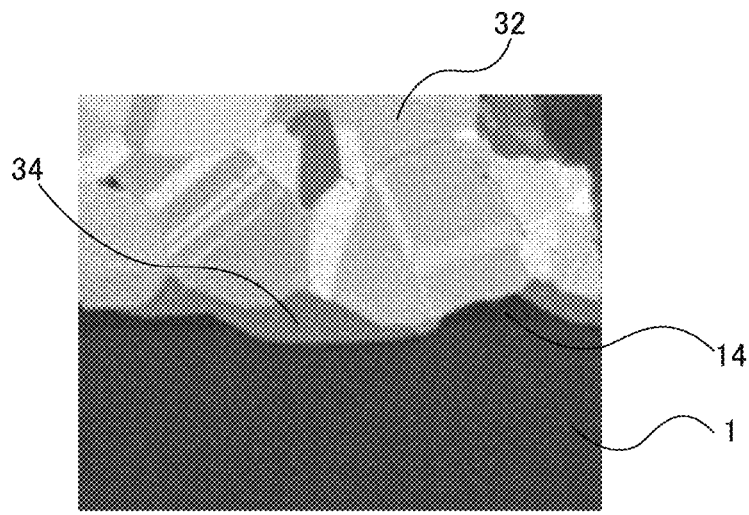
FIG. 8 is a scanning electron microscope (SEM) micrograph obtained by observing a cross-section of the sample shown in FIG. 6 in the vicinity of a back side TAB electrode with a scanning electron microscope.
Figure 9:
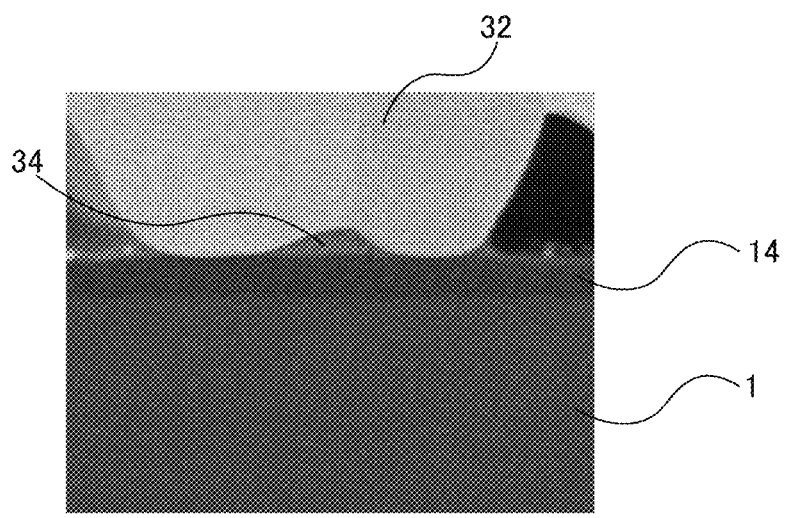
FIG. 9 is a scanning electron microscope (SEM) micrograph obtained by observing a cross-section of the sample shown in FIG. 7 in the vicinity of a back side TAB electrode with a scanning electron microscope.

Furthermore, cross-sections of the samples shown in FIGS. 6 and 7 were observed with a scanning electron microscope (SEM) for the purpose of confirmation. FIG. 8 indicates a SEM micrograph of the back side of the sample shown in FIG. 6 having the back side TAB electrodes 15*a* formed thereon. In addition, FIG. 9 indicates a SEM micrograph of the back side of the sample shown in FIG. 7 having the back side electrodes 15*a* formed thereon. As is clear from FIG. 8, in the case of a sample for which "Reactivity of conductive paste to passivation film" was judged to be "Present", portions are present where the back side passivation film 14 was eroded by glass frit 32, thereby resulting in a loss of a portion of the back side passivation film 14. On the other hand, as is clear from FIG. 9, in the case of a sample for which "Reactivity of conductive paste to passivation film" was judged to be "Absent", the back side passivation film 14 nearly completely retained its original form and the back side passivation film 14 was not eroded by the glass frit 32 even after the back side TAB electrodes 15*a* were formed. On the basis of the above, it is clear that the presence or absence of reactivity of a conductive paste to a passivation film can be evaluated by measuring according to the PL method as described above.

Examples 1 to 23 and Comparative Examples 1 to 3

Conductive pastes were prepared to which the glass frit formulated as shown in Tables 1 to 6 was added so as to reach the added amounts shown in Tables 1 to 6. These conductive pastes were used to produce substrates for measuring soldering adhesive strength and substrates for measuring according to the photoluminescence method (PL method) to produce the substrates for measuring soldering adhesive strength and substrates for measuring according to the photoluminescence method (PL method) in Examples 1 to 23 and Comparative Examples 1 to 3. The results of measuring soldering adhesive strength and measuring according to the PL method are shown in Tables 1 to 6.

As is clear from the measurement results shown in Tables 1 to 6, the soldering adhesive strength (N/mm) of Examples 1 to 23 of the present invention all exhibited values of 1.5 N/mm or more and can be therefore be said to sufficiently demonstrate favorable adhesive strength in terms of soldering adhesive strength. Namely, in the case of Examples 1 to 23, adhesive strength between the formed electrodes and the passivation films can be said to be favorable.

In addition, "Reactivity of conductive paste to passivation film" of Examples 1 to 23 of the present invention was judged to be "Absent" in all of these examples. Thus, in the case of having formed the back side TAB electrodes 15*a* using the conductive pastes of Examples 1 to 23 of the present invention, there can be said to be no detrimental effect on the passivation film so as to affect solar cell properties.

In contrast, soldering adhesive strength (N/mm) of the metal ribbon of Comparative Examples 1 to 3 was 1.3 N/mm or less. Thus, soldering adhesive strength (N/mm) of the metal ribbon of Comparative Examples 1 to 3 cannot be said to be sufficiently favorable in terms of soldering adhesive strength. Namely, in the case of Comparative Examples 1 to 3, adhesive strength between the formed electrodes and the passivation films cannot be said to be sufficiently favorable.

On the basis of the above, it the case of Examples 1 to 23 using the conductive paste of the present invention, it is clear that favorable results were able to be obtained for adhesive strength between electrodes and passivation films in comparison with Comparative Examples 1 to 3. In addition, "Reactivity of conductive paste to passivation film" was such that there can be said to be no detrimental effect on the passivation films so as to affect properties of a solar cell in the case of Examples 1 to 23.

TABLE 1

|  |  | Example 1 | Example 2 | Example 3 | Example 4 | Example 5 |
|---|---|---|---|---|---|---|
| Silver particles | Added amount (parts by weight) | 100 | 100 | 100 | 100 | 100 |
|  | BET specific surface area (m²/g) | 0.72 | 0.72 | 0.72 | 0.72 | 0.72 |
| Glass frit | Type of glass frit molar ratio of incorporated amount (mol %) | | | | | |
|  | $SiO_2$ | 24.6 | 22.0 | 24.2 | 24.0 | 24.0 |
|  | $B_2O_3$ | 20.7 | 21.0 | 20.8 | 20.6 | 20.8 |
|  | $Bi_2O_3$ | 19.5 | 20.8 | 18.8 | 18.5 | 18.6 |
|  | $TeO_2$ | 1.9 | 5.0 | 1.3 | 2.4 | 1.9 |
|  | $TiO_2$ | 4.3 | 4.2 | 4.6 | 4.5 | 4.6 |
|  | $Al_2O_3$ | 4.0 | 5.0 | 3.5 | 3.5 | 3.5 |
|  | ZnO | 25.0 | 22.0 | 26.8 | 26.5 | 26.6 |
|  | Total | 100.0 | 100.0 | 100.0 | 100.0 | 100.0 |
|  | Added amount (parts by weight) | 0.9 | 1.1 | 0.85 | 0.9 | 0.88 |
|  | Softening point (° C.) | 488.9 | 462.5 | 498.8 | 488.9 | 492.7 |
| Added particles | Material | — | — | — | — | — |
|  | Added amount (parts by weight) | — | — | — | — | — |
| Reactivity of conductive paste to passivation film | | Absent | Absent | Absent | Absent | Absent |
| Soldering adhesive strength (N/mm) | | 1.8 | 1.9 | 2.1 | 2.7 | 1.6 |

TABLE 2

|  |  | Example 6 | Example 7 | Example 8 | Example 9 | Comparative Example 1 |
|---|---|---|---|---|---|---|
| Silver particles | Added amount (parts by weight) | 100 | 100 | 100 | 100 | 100 |
|  | BET specific surface area (m²/g) | 0.72 | 0.72 | 0.72 | 0.72 | 0.72 |
| Glass frit | Type of glass frit molar ratio of incorporated amount (mol %) | | | | | |
|  | $SiO_2$ | 15.3 | 22.2 | 20.3 | 21.8 | 24.5 |
|  | $B_2O_3$ | 36.1 | 19.1 | 17.7 | 20.8 | 21.1 |
|  | $Bi_2O_3$ | 24.4 | 17.1 | 15.6 | 20.8 | 19.0 |
|  | $TeO_2$ | 2.2 | 9.6 | 17.7 | 3.7 | — |
|  | $TiO_2$ | — | 4.2 | 3.8 | 4.2 | 4.6 |
|  | $Al_2O_3$ | 6.5 | 3.2 | 2.9 | 4.6 | 3.6 |
|  | ZnO | 15.5 | 24.6 | 22.0 | 24.2 | 27.2 |
|  | Total | 100.0 | 100.0 | 100.0 | 100.0 | 100.0 |
|  | Added amount (parts by weight) | 0.88 | 0.95 | 1.1 | 1.0 | 0.8 |
|  | Softening point (° C.) | 474.5 | 480.0 | 458.2 | 472.0 | 510.0 |
| Added particles | Material | — | — | — | — | — |
|  | Added amount (parts by weight) | — | — | — | — | — |
| Reactivity of conductive paste to passivation film | | Absent | Absent | Absent | Absent | Absent |
| Soldering adhesive strength (N/mm) | | 1.7 | 2.0 | 2.3 | 1.8 | 1.3 |

TABLE 3

|  |  | Example 10 | Example 11 | Example 12 | Example 13 | Comparative Example 2 |
|---|---|---|---|---|---|---|
| Silver particles | Added amount (parts by weight) | 100 | 100 | 100 | 100 | 100 |
|  | BET specific surface area (m²/g) | 0.72 | 0.72 | 0.72 | 0.72 | 0.72 |
| Glass frit | Type of glass frit molar ratio of | | | | | |
|  | $SiO_2$ | 22.9 | 20.5 | 20.5 | 23.2 | 24.6 |
|  | $B_2O_3$ | 19.7 | 17.7 | 17.7 | 20.0 | 22.6 |
|  | $Bi_2O_3$ | 17.9 | 15.9 | 15.9 | 18.0 | 5.0 |

TABLE 3-continued

|  |  | Example 10 | Example 11 | Example 12 | Example 13 | Comparative Example 2 |
|---|---|---|---|---|---|---|
| incorporated amount (mol %) | $TeO_2$ | 6.7 | 16.3 | 16.3 | 5.3 | 17.7 |
|  | $TiO_2$ | 4.3 | 3.9 | 3.9 | 4.4 | 4.5 |
|  | $Al_2O_3$ | 3.4 | 3.0 | 3.0 | 3.5 | 3.5 |
|  | ZnO | 25.1 | 22.7 | 22.7 | 25.6 | 22.1 |
|  | Total | 100.0 | 100.0 | 100.0 | 100.0 | 100.0 |
|  | Added amount (parts by weight) | 1.1 | 1.3 | 1.6 | 0.9 | 0.9 |
|  | Softening point (° C.) | 458.2 | 436.9 | 415.0 | 467.8 | 362.2 |
| Added particles | Material | — | — | — | — | — |
|  | Added amount (parts by weight) | — | — | — | — | — |
| Reactivity of conductive paste to passivation film |  | Absent | Absent | Absent | Absent | Absent |
| Soldering adhesive strength (N/mm) |  | 1.8 | 1.7 | 1.7 | 1.8 | 1.1 |

TABLE 4

|  |  | Comparative Example 3 | Example 14 | Example 15 | Example 16 | Example 17 |
|---|---|---|---|---|---|---|
| Silver particles | Added amount (parts by weight) | 100 | 100 | 100 | 100 | 100 |
|  | BET specific surface area (m²/g) | 0.72 | 0.72 | 0.72 | 0.72 | 0.72 |
| Glass frit | Type of glass frit molar ratio of incorporated amount (mol %) | $SiO_2$ | 14.7 | 24.0 | 24.0 | 24.0 | 24.0 |
|  | $B_2O_3$ | 12.6 | 20.6 | 20.6 | 20.6 | 20.6 |
|  | $Bi_2O_3$ | 11.5 | 18.5 | 18.5 | 18.5 | 18.5 |
|  | $TeO_2$ | 40.5 | 2.4 | 2.4 | 2.4 | 2.4 |
|  | $TiO_2$ | 2.7 | 4.5 | 4.5 | 4.5 | 4.5 |
|  | $Al_2O_3$ | 1.6 | 3.5 | 3.5 | 3.5 | 3.5 |
|  | ZnO | 16.4 | 26.5 | 26.5 | 26.5 | 26.5 |
|  | Total | 100.0 | 100.0 | 100.0 | 100.0 | 100.0 |
|  | Added amount (parts by weight) | 0.9 | 0.9 | 0.9 | 0.9 | 0.9 |
|  | Softening point (° C.) | 320.0 | 488.9 | 488.9 | 488.9 | 488.9 |
| Added particles | Material | — | Titanium resinate | Titanium oxide | Cobalt oxide | Cerium oxide |
|  | Added amount (parts by weight) | — | 0.2 | 0.2 | 0.2 | 0.2 |
| Reactivity of conductive paste to passivation film |  | Absent | Absent | Absent | Absent | Absent |
| Soldering adhesive strength (N/mm) |  | 0.6 | 3.0 | 2.8 | 2.8 | 2.8 |

TABLE 5

|  |  | Example 18 | Example 19 | Example 20 | Example 21 | Example 22 |
|---|---|---|---|---|---|---|
| Silver particles | Added amount (parts by weight) | 100 | 100 | 100 | 100 | 100 |
|  | BET specific surface area (m²/g) | 0.72 | 0.72 | 0.72 | 1.40 | 0.54 |
| Glass frit | Type of glass frit molar ratio of incorporated amount (mol %) | $SiO_2$ | 24.0 | 24.0 | 24.0 | 24.0 | 24.0 |
|  | $B_2O_3$ | 20.6 | 20.6 | 20.6 | 20.6 | 20.6 |
|  | $Bi_2O_3$ | 18.5 | 18.5 | 18.5 | 18.5 | 18.5 |
|  | $TeO_2$ | 2.4 | 2.4 | 2.4 | 2.4 | 2.4 |
|  | $TiO_2$ | 4.5 | 4.5 | 4.5 | 4.5 | 4.5 |
|  | $Al_2O_3$ | 3.5 | 3.5 | 3.5 | 3.5 | 3.5 |
|  | ZnO | 26.5 | 26.5 | 26.5 | 26.5 | 26.5 |
|  | Total | 100.0 | 100.0 | 100.0 | 100.0 | 100.0 |
|  | Added amount (parts by weight) | 0.9 | 0.9 | 0.9 | 0.9 | 0.9 |

TABLE 5-continued

|  |  | Example 18 | Example 19 | Example 20 | Example 21 | Example 22 |
|---|---|---|---|---|---|---|
|  | Softening point (° C.) | 488.9 | 488.9 | 488.9 | 488.9 | 488.9 |
| Added particles | Material | Silicon nitride | Copper-manganese-tin | Aluminosilicate and aluminum silicate | — | — |
|  | Added amount (parts by weight) | 0.2 | 0.2 | 0.2 | — | — |
| Reactivity of conductive paste to passivation film |  | Absent | Absent | Absent | Absent | Absent |
| Soldering adhesive strength (N/mm) |  | 2.6 | 3.7 | 3.4 | 2.5 | 2.3 |

TABLE 6

|  |  |  | Example 23 |
|---|---|---|---|
| Silver particles | Added amount (parts by weight) |  | 100 |
|  | BET specific surface area (m²/g) |  | 0.40 |
| Glass frit | Type of glass frit molar ratio of incorporated amount (mol %) | $SiO_2$ | 24.0 |
|  |  | $B_2O_3$ | 20.6 |
|  |  | $Bi_2O_3$ | 18.5 |
|  |  | $TeO_2$ | 2.4 |
|  |  | $TiO_2$ | 4.5 |
|  |  | $Al_2O_3$ | 3.5 |
|  |  | ZnO | 26.5 |
|  |  | Total | 100.0 |
|  | Added amount (parts by weight) |  | 0.9 |
|  | Softening point (° C.) |  | 488.9 |
| Added particles | Material |  | — |
|  | Added amount (parts by weight) |  | — |
| Reactivity of conductive paste to passivation film |  |  | Absent |
| Soldering adhesive strength (N/mm) |  |  | 2.1 |

BRIEF DESCRIPTION OF REFERENCE SYMBOLS

1 Crystalline silicon substrate (p-type crystalline silicon substrate)
2 Antireflective film
4 Impurity diffusion layer (n-type impurity diffusion layer)
14 Back side passivation film
15 Back side electrodes
15a Back side TAB electrodes (back side bus bar electrodes)
15b Back side electrodes (back side full-surface electrodes)
16 Impurity diffusion layer (p-type impurity diffusion layer)
18 Impurity diffusion portions (p-type impurity diffusion portions)
20 Light incident side electrodes (surface electrodes)
20a Light incident side bus bar electrodes
20b Light incident side finger electrodes
32 Silver

The invention claimed is:

1. A conductive paste for forming an electrode on a passivation film of a solar cell, the conductive paste comprising:
(A) silver particles,
(B) an organic vehicle, and
(C) a glass frit comprising $TeO_2$ at 1.0 mol % to 9.6 mol %, $Bi_2O_3$ at 10 mol % to 30 mol %, and $SiO_2$ at 5 mol % to 30 mol %,
wherein the glass frit (C) does not contain PbO.

2. The conductive paste according to claim 1, wherein the specific surface area of the silver particles (A) is 0.4 m²/g to 1.5 m²/g.

3. The conductive paste according to claim 1, wherein the organic vehicle (B) comprises at least one of ethyl cellulose, rosin ester, butyral, acrylic and organic solvent.

4. The conductive paste according to claim 1, wherein the glass frit (C) further comprises ZnO at 10 mol % to 30 mol %.

5. The conductive paste according to claim 1, wherein the glass frit (C) further comprises $Al_2O_3$ at 1 mol % to 10 mol %.

6. The conductive paste according to claim 1, wherein the glass frit (C) further comprises $TiO_2$ at 1 mol % to 20 mol %.

7. The conductive paste according to claim 1, comprising at least one additive selected from titanium resinate, titanium oxide, cobalt oxide, cerium oxide, silicon nitride, copper-manganese-tin, aluminosilicate and aluminum silicate.

8. The conductive paste according to claim 1, wherein the conductive paste is a conductive paste for forming back side TAB electrodes.

9. A solar cell in which electrodes are formed using the conductive paste according to claim 1.

10. The solar cell according to claim 9, wherein the specific surface area of the silver particles (A) in the conductive paste is 0.4 m²/g to 1.5 m²/g.

11. The solar cell according to claim 9, wherein the organic vehicle (B) in the conductive paste comprises at least one of ethyl cellulose, rosin ester, butyral, acrylic and organic solvent.

12. The solar cell according to claim 9, wherein the glass frit (C) in the conductive paste further comprises ZnO at 10 mol % to 30 mol %.

13. The solar cell according to claim 9, wherein the glass frit (C) in the conductive paste further comprises $Al_2O_3$ at 1 mol % to 10 mol %.

14. The solar cell according to claim 9, wherein the glass frit (C) in the conductive paste further comprises $TiO_2$ at 1 mol % to 20 mol %.

15. The solar cell according to claim 9, wherein the conductive paste comprises at least one additive selected from titanium resinate, titanium oxide, cobalt oxide, cerium oxide, silicon nitride, copper-manganese-tin, aluminosilicate and aluminum silicate.

16. The solar cell according to claim 9, wherein the electrodes are back side TAB electrodes of the solar cell.

17. A conductive paste for forming an electrode on a passivation film of a solar cell, the conductive paste comprising:
- (A) silver particles,
- (B) an organic vehicle, and
- (C) glass frit comprising $TeO_2$ at 1.0 mol % to 9.6 mol %, $Bi_2O_3$ at 10 mol % to 30 mol % and $SiO_2$ at 5 mol % to 30 mol %, wherein the glass frit (C) consists of at least three oxides, the at least three oxides including $TeO_2$, $Bi_2O_3$, and $SiO_2$, and optionally including one or more of $TiO_2$, ZnO, $Al_2O_3$, $B_2O_3$, $WO_3$, BaO, $Ag_2O$ and $MoO_3$.

* * * * *